(12) United States Patent
Inoue

(10) Patent No.: US 7,772,597 B2
(45) Date of Patent: Aug. 10, 2010

(54) LIGHT EMITTING DIODE LAMP

(75) Inventor: Tomio Inoue, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 514 days.

(21) Appl. No.: 11/597,493

(22) PCT Filed: Apr. 20, 2005

(86) PCT No.: PCT/JP2005/007522

§ 371 (c)(1),
(2), (4) Date: Nov. 22, 2006

(87) PCT Pub. No.: WO2005/117148

PCT Pub. Date: Dec. 8, 2005

(65) Prior Publication Data

US 2007/0221934 A1    Sep. 27, 2007

(30) Foreign Application Priority Data

May 27, 2004   (JP)   ............... 2004-157221

(51) Int. Cl.
*H01L 27/15* (2006.01)
(52) U.S. Cl. ............... 257/79; 257/98; 257/99; 257/100; 257/E21.252; 257/E21.274; 257/E21.311
(58) Field of Classification Search .............. 257/79, 257/98–100
See application file for complete search history.

(56) References Cited

U.S. PATENT DOCUMENTS

2001/0000622 A1   5/2001   Reeh et al.

(Continued)

FOREIGN PATENT DOCUMENTS

JP    11-40848    2/1999

(Continued)

OTHER PUBLICATIONS

International Search Report for the corresponding International application PCT/JP2005/007522, mailed Jul. 26, 2005.

*Primary Examiner*—A. Sefer
(74) *Attorney, Agent, or Firm*—Hamre, Schumann, Mueller & Larson, P.C.

(57) ABSTRACT

The present invention relates to an LED lamp including a pair of lead terminals 2 and 3, a cup portion 8 formed at an end of one of the lead terminals by denting the end and having a conical inner peripheral surface serving as a light-reflective surface 9, an LED chip 4, a transparent synthetic resin member 6 covering the ends of the paired lead terminals 2 and 3. The LED chip 4 includes an upper surface provided with an n-electrode 4*d* or a p-electrode 4*e* and a lower surface provided with a p-electrode 4*e* or an n-electrode 4*d*. An n-type semiconductor layer 4*a* and a p-type semiconductor layer 4*b* are provided between the n-electrode 4*d* and the p-electrode 4*e* and laminated to each other via a light emitting layer 4*c* interposed therebetween. The side surface of the LED chip 4 except for the n-electrode 4*d* and the p-electrode 4*e* is coated with light-transmitting synthetic resin 10 containing powder of a fluorescent material. The LED chip 4 is die-bonded to an inner bottom surface of the cup portion 8 with the n-electrode 4*d* or the p-electrode 4*e* oriented downward whereas the p-electrode 4*e* or the n-electrode 4*d* oriented upward.

8 Claims, 5 Drawing Sheets

U.S. PATENT DOCUMENTS

| | | | |
|---|---|---|---|
| 2002/0088985 A1* | 7/2002 | Komoto et al. | 257/99 |
| 2003/0214233 A1* | 11/2003 | Takahashi et al. | 313/512 |
| 2004/0061433 A1 | 4/2004 | Izuno et al. | |

FOREIGN PATENT DOCUMENTS

| | | | |
|---|---|---|---|
| JP | 11-317546 | * | 11/1999 |
| JP | 2000-512806 | | 9/2000 |
| JP | 2000-312033 | | 11/2000 |
| JP | 2002-261325 | | 9/2002 |
| JP | 2002-324915 | | 11/2002 |
| JP | 2002-353518 | | 12/2002 |
| JP | 2003-188422 | | 7/2003 |
| JP | 2003-218401 | | 7/2003 |
| JP | 2003-258320 | * | 9/2003 |
| WO | WO 03/034508 | | 4/2003 |

* cited by examiner

LIGHT EMITTING DIODE LAMP

TECHNICAL FIELD

The present invention relates to an LED lamp provided by die-bonding an LED chip on an inner bottom surface of a cup portion formed at an end of a lead terminal made of metal and covering the end of the lead terminal by a transparent synthetic resin member or loading transparent synthetic rein into the cup portion, or an LED lamp provided by forming a light-reflective electrode film on an inner surface of a cup portion formed at an insulating member by denting, die-bonding an LED chip on an inner bottom surface of the cup portion and loading transparent synthetic resin into the cup portion.

BACKGROUND ART

Recently, a GaN-based LED chip which emits blue light has been developed, and it is well known that this type of LED chip which emits blue light has a high luminance.

Further, recently, by utilizing the fact that such an LED chip which emits blue light has a high luminance, a surface of the LED chip is coated with light-transmitting synthetic resin containing a fluorescent material so that the light in the blue wavelength range is partially changed into yellow light by the fluorescent material contained in the coating. With this arrangement, white light with a high intensity can be generated by the color mixture.

FIG. 5 of the Patent Document 1 as a prior art shows such an LED lamp. In this LED lamp, an end of one of two lead terminals, which are made of metal, is dented to form a cup portion having an inner peripheral surface serving as a light-reflective surface. A blue LED chip is die-bonded at the inner bottom surface of the cup portion, and the LED chip is connected to the other one of the two lead terminals via a thin metal wire. The ends of the two lead terminals are covered by a transparent synthetic resin member. The blue light is changed into white light by loading, in advance, light-transmitting synthetic resin containing powder of a fluorescent material into the cup portion so that the entirety of the LED chip is embedded in the resin.

In another prior-art LED lamp, a cup portion having an inner peripheral surface flaring outward is formed at an end surface of an insulating member by denting, and a light-reflective electrode film is formed on the inner surface of the cup portion. A blue LED chip is die-bonded at the inner bottom surface of the cup portion, and light-transmitting synthetic resin containing powder of a fluorescent material is loaded into the cup portion so that the entirety of the LED chip is embedded. With this arrangement, the blue light is changed into white light.

Patent Document 1: JP-A-H11-40848

DISCLOSURE OF THE INVENTION

Problems to be Solved by the Invention

In the prior-art structures described above, after the LED chip is die-bonded in the cup portion, light-transmitting synthetic resin containing powder of a fluorescent material is loaded, in a liquid state, into the entire cup portion to embed the LED chip. In the process in which the light emitted from the LED chip travels through the light-transmitting synthetic resin loaded in the cup portion and containing powder of a fluorescent material, the wavelength of the light changes. Further, in this process, the direction in which the light exits the cup portion is changed by the light-reflective surface provided on the inner surface of the cup portion. Since the light travels through a long path within the light-transmitting synthetic resin in which the fluorescent material is dispersed before and after reaching the light-reflective surface, the attenuation of light in traveling through the light-transmitting synthetic resin is considerably large, whereby the luminance of the light is reduced.

Further, in loading the light-transmitting synthetic resin into the cup portion, the amount of resin loaded in the cup portion may vary in each of LED lamps. Therefore, the amount of the fluorescent material varies correspondingly, which results in variation in the color tone.

A technical object of the present invention is to provide an LED lamp which is designed to change the color tone of light emitted from the LED chip by light-transmitting synthetic resin containing powder of a fluorescent material and which is free from the above-described problems.

Means for Solving the Problems

To attain the above object, according to claim 1 of the present invention, there is provided a light emitting diode lamp comprising: a pair of lead terminals; a cup portion formed at an end of one of the lead terminals and including a dented inner peripheral surface flaring outward to serve as a light-reflective surface; an LED chip; and a transparent synthetic resin member for covering ends of the lead terminals or for filling the cup portion to cover the LED chip. The LED chip includes an upper surface provided with an n-electrode or a p-electrode and a lower surface provided with a p-electrode or an n-electrode. The LED chip also includes an n-type semiconductor layer and a p-type semiconductor layer both provided between the n-electrode and the p-electrode and laminated to each other via a light emitting layer interposed therebetween. The LED chip further includes a side surface covered by a light-transmitting synthetic resin coating containing powder of a fluorescent material, the resin coating being arranged not to cover the n-electrode and the p-electrode. The LED chip is arranged in the cup portion with the n-electrode or p-electrode oriented downward and the p-electrode or n-electrode oriented upward. The LED chip is die-bonded so that the downward n- or p-electrode is electrically connected to an inner bottom surface of the cup portion.

According to claim 2 of the present invention, there is provided a light emitting diode lamp comprising: an insulating member; a dented cup portion formed at the insulating member and having an inner peripheral surface flaring outward; a light reflective electrode film formed inside of the cup portion; an LED chip; and a transparent synthetic resin member filling the cup portion to cover the LED chip. The LED chip includes an upper surface provided with an n-electrode or a p-electrode and a lower surface provided with a p-electrode or an n-electrode. The LED chip also includes an n-type semiconductor layer and a p-type semiconductor layer both provided between the n-electrode and the p-electrode and laminated to each other via a light emitting layer interposed therebetween. The LED chip further includes a side surface covered by a light-transmitting synthetic resin coating containing powder of a fluorescent material, the resin coating being arranged not to cover the n-electrode and the p-electrode. The LED chip is arranged in the cup portion with the n-electrode or p-electrode oriented downward and the p-electrode or n-electrode oriented upward. The LED chip is die-bonded so that the downward n- or p-electrode is electrically connected to the electrode film at an inner bottom surface of the cup portion.

According to claim 3 of the present invention, in the LED lamp of claim 1, the cup portion is in the form of a rectangle elongated horizontally in plan view, and the transparent synthetic resin member is in the form of a plate. This resin member covers the lead terminals so that the lead terminals are partially exposed at a surface of the transparent synthetic resin member to serve as a connection terminal.

According to claim 4 of the present invention, in the LED lamp of claim 2, the insulating member is in the form of a plate, and the cup portion is in the form of a rectangle elongated horizontally in plan view.

According to claim 5 of the present invention, in the LED lamp of any one of claims 1 to 4, the p-electrode or the n-electrode of the LED chip which is oriented upward is covered by a light-transmitting synthetic resin coating containing powder of a fluorescent material.

ADVANTAGES OF THE INVENTION

The LED chip according to the present invention includes an upper surface provided with an n-electrode or a p-electrode and a lower surface provided with a p-electrode or an n-electrode, and an n-type semiconductor layer and a p-type semiconductor layer which are provided between the n-electrode and the p-electrode and laminated to each other via a light emitting layer interposed therebetween. Further, the side surface of the LED chip, but not the n-electrode and the p-electrode, is coated with light-transmitting synthetic resin containing powder of a fluorescent material. With this structure, the light generated at the light emitting layer of the LED chip is mainly emitted laterally from the side surface between the n-electrode and the p-electrode by passing through the light-transmitting synthetic resin covering the side surface.

The LED chip is arranged in the cup portion formed by denting a lead terminal or an insulating member with the n-electrode or the p-electrode oriented downward while the p-electrode or the n-electrode oriented upward and die-bonded so that the n-electrode or the p-electrode which is oriented downward is electrically connected to an inner bottom surface of the cup portion or an electrode film in the inner bottom surface. Thus, the wavelength of the light emitted laterally is changed in passing through the light-transmitting synthetic resin formed at the side surface. The light after the wavelength is changed is reflected at the light-reflective surface at the inner peripheral surface of the cup portion to exit the cup portion.

In this way, differing from the prior art structure in which both the wavelength change and the reflection of light occur in the process of passing through the light-transmitting synthetic resin containing powder of a fluorescent material, the wavelength is first changed by the light-transmitting synthetic resin-containing a fluorescent material, and the light reflection is performed after the wavelength change in the present invention. Accordingly, as compared with the prior art structure, attenuation of light is considerably small, which contributes to considerable enhancement of the luminance of the LED lamp.

Further, unlike the prior art structure, the light-transmitting synthetic resin containing powder of a fluorescent material is not loaded so as to fill the entirety of the cup portion. Therefore, as compared with the prior art structure, variation in the color of the light after the wavelength is changed by the light-transmitting synthetic resin containing powder of a fluorescent material is small.

As set forth in claim 3, the cup portion may be in the form of a rectangle elongated horizontally in plan view, and the transparent synthetic resin member may be in the form of a plate and cover the lead terminals so that the lead terminals are partially exposed at a surface of the transparent synthetic resin member to serve as a connection terminal. With this arrangement, a surface-mount LED lamp with a high luminance and small variation in color can be provided. Such an LED lamp can be suitably used as a backlight source of e.g. a liquid crystal display.

As set forth in claim 4, the insulating member may be in the form of a plate, and the cup portion may be in the form of a rectangle elongated horizontally in plan view. With this arrangement, similarly to the structure of claim 3 described above, a surface-mount LED lamp with a high luminance and small variation in color can be provided. Particularly, with the structure of claim 4, the entirety of the lamp is in the form of a plate, and a lead terminal made of metal is not used. Therefore, a light-weight surface-mount LED lamp can be provided.

By claim 5, in the LED lamp according to any one of claims 1-4, the color of the light leaking through the p-electrode or the n-electrode of the LED chip which is oriented upward can be changed by the light-transmitting synthetic resin applied to the p-electrode or the n-electrode and containing powder of a fluorescent material similarly to the color change by the light-transmitting synthetic resin applied to the side surface of the LED chip. Further, by applying the light-transmitting synthetic resin containing powder of a fluorescent material to the side surface and upper surface of the LED chip, the color tone can be adjusted delicately.

Figure 1:
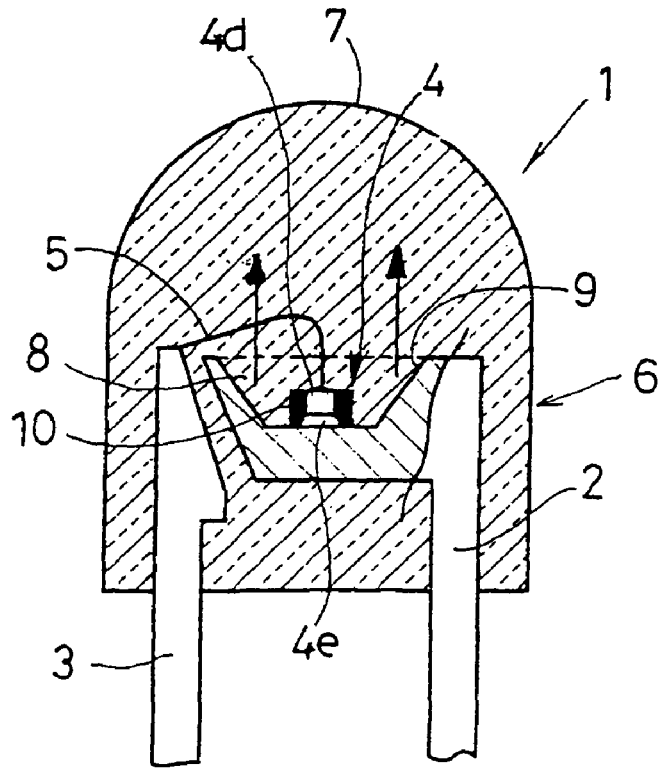
FIG. 1 shows a principal portion of an LED lamp according to a first embodiment.

DESCRIPTION OF SIGNS 1, 11, 21, 31, 41, 51 LED lamp
2, 2' lead terminal
3, 3' lead terminal
2" electrode film
3" electrode film
4 LED chip
4a n-type semiconductor layer
4b p-type semiconductor layer
4c light emitting layer
4d n-electrode
4e p-electrode
5, 5', 5" metal wire
6, 6', 6" transparent synthetic resin member
8, 8', 8" cup portion
9 light-reflective surface 10 light-transmitting synthetic resin
12, 32 light-transmitting synthetic resin
52 insulating member

BEST MODE FOR CARRYING OUT THE INVENTION

Preferred embodiments of the present invention will be described below in detail with reference to the accompanying drawings.

FIG. 1 shows a light emitting diode lamp 1 according to a first embodiment of the present invention.

The LED lamp 1 includes a pair of lead terminals 2 and 3 made of a metal plate, an LED chip 4 die-bonded to an end of one of the led terminal 2 and 3, e.g. the lead terminal 2 and having the structure described below, a metal wire 5 connecting the LED chip 4 and the other lead terminal 3 by wire bonding, and a molded portion 6 made of a transparent synthetic resin and covering the ends of the lead terminals 2 and 3.

An end of the molded portion 6 serves as a lens 7 focusing on the LED chip 4 or the neighboring portions.

The end of the lead terminal to which the LED chip 4 is die-bonded is formed with a cup portion 8 by denting. The inner peripheral surface of the cup portion 8 is a conical light-reflective surface 9.

In the case where the two lead terminals 2 and 3 are made of a metal which does not reflect light, of the surfaces of the lead terminals 2 and 3, at least the inner surface of the cup portion 8 is plated with a metal which reflects light such as silver, for example.

Figure 2:
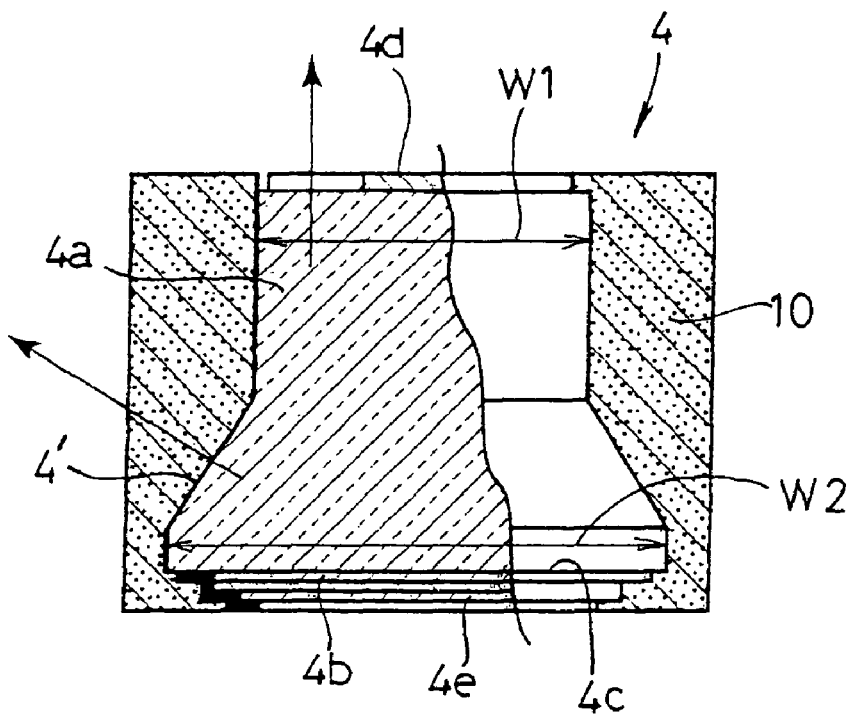
FIG. 2 is a sectional view, partially cut away, showing an LED chip according to the present invention.
Figure 3:
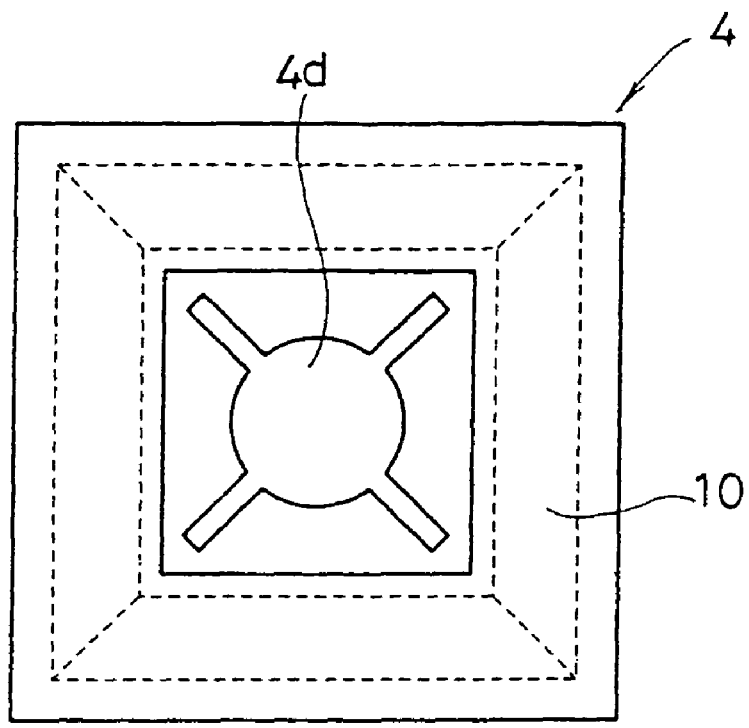
FIG. 3 is a plan view of FIG. 2.

Next, with reference to FIGS. 2 and 3, the LED chip 4 will be described in detail.

The LED chip 4 comprises a thick transparent n-type semiconductor layer 4a made of e.g. an n-type SiC crystal substrate, a p-type semiconductor layer 4b laminated on the lower surface of the n-type semiconductor layer via a light-emitting layer 4c for emitting blue light. The upper surface of the n-type semiconductor layer 4a is provided with an n-electrode 4d, whereas the lower surface of the p-type semiconductor layer 4b is provided with a p-electrode 4e. That is, the LED chip is provided by laminating the n-type semiconductor layer 4a and the p-type semiconductor layer 4b with the light emitting layer 4c for emitting blue light interposed therebetween and forming the n-electrode 4d to be connected to the n-type semiconductor layer 4a on the upper surface of the laminated structure while forming the p-electrode 4e to be connected to the p-type semiconductor layer 4b on the lower surface of the laminated structure.

The side surface of the LED chip 4 includes an inclined surface 4' so that the width W1 of the portion above the inclined surface is smaller than the width W2 of the portion below the inclined surface.

The side surface of the LED chip 4 except for the n-electrode 4d on the upper surface and the p-electrode 4e on the lower surface is coated with light-transmitting synthetic resin 10 containing a fluorescent material for changing blue light to white light in a powder state.

The LED chip 4 having the above-described structure is arranged in the cup portion 8 of the lead terminal 2, with the p-electrode 4e oriented downward while the n-electrode 4d oriented upward. The LED chip is die-bonded to the inner bottom surface of the cup portion 8 via conductive paste or solder so that the p-electrode 4e is electrically connected thereto. The n-electrode 4d of the LED chip 4 which is oriented upward is connected to the lead terminal 3 by the metal wire 5.

The transparent synthetic resin member 6, which includes a lens portion at the end thereof, covers the ends of the two lead terminals 2 and 3 so that each of the lead terminals 2 and 3 partially projects downward from the lower surface of the transparent synthetic resin member 6.

With this structure, blue light generated at the light-emitting layer 4c of the LED chip 4 by applying a current across the two lead terminals 2 and 3 is emitted laterally from the side surface of the LED chip 4 toward the light-reflective surface 9 of the inner periphery of the cup portion 8 by passing through the light-transmitting synthetic resin 10 covering the side surface. Thus, the blue light is changed into white light by the fluorescent material contained in the light-transmitting synthetic resin 10 and then reflected by the light-reflective surface 9 to exit the cup portion 8.

Figure 4:
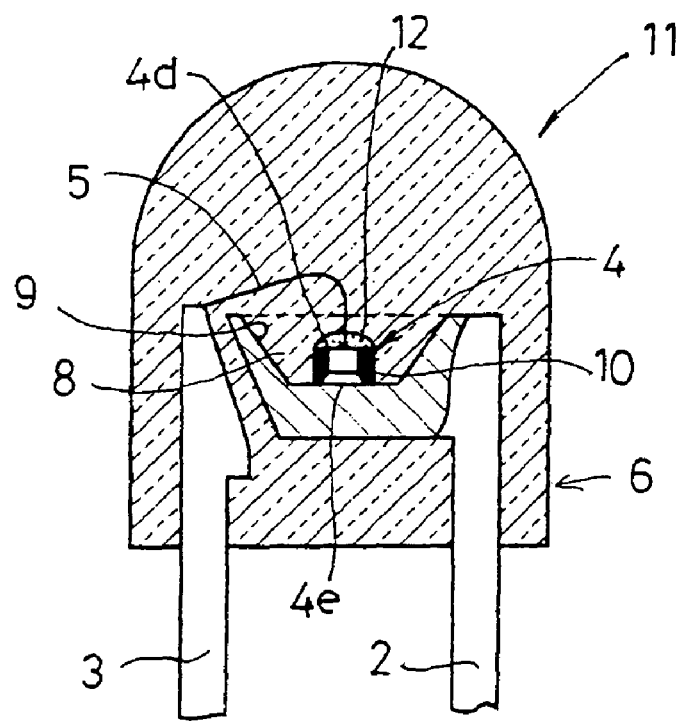
FIG. 4 shows a principal portion of an LED lamp according to a second embodiment.

With the above-described structure, part of the blue light generated at the light emitting layer 4c of the LED chip 4 may be emitted upward through the n-electrode 4d on the upper surface. In this case, like the LED lamp 11 according to the second embodiment shown in FIG. 4, the n-electrode 4d on the upper surface is also coated with light-transmitting synthetic resin 12 containing a fluorescent material in a powder state after the metal wire 5 for wire bonding is connected to the electrode. With this structure, the blue light generated at the light emitting layer 4c of the LED chip 4 can be entirely changed into white light.

In the first and the second embodiments, the LED chip 4 is die-bonded in the cup portion 8 of the lead terminal 2 with the n-electrode 4d oriented upward while the p-electrode 4e oriented downward, and the n-electrode 4d oriented upward is connected to the lead terminal 3 via the metal wire 5. However, the present invention is not limited to this structure. Like the LED lamp 21 according to a third embodiment shown in FIG. 5, the LED chip 4 may be die-bonded in the cup portion 8 of the lead terminal 2 with the p-electrode 4e oriented upward while the n-electrode 4d oriented downward, and the p-electrode 4e oriented upward may be connected to the lead terminal 3 via the metal wire 5. With this structure, the same advantages as those of the first embodiment can be obtained.

Figure 5:
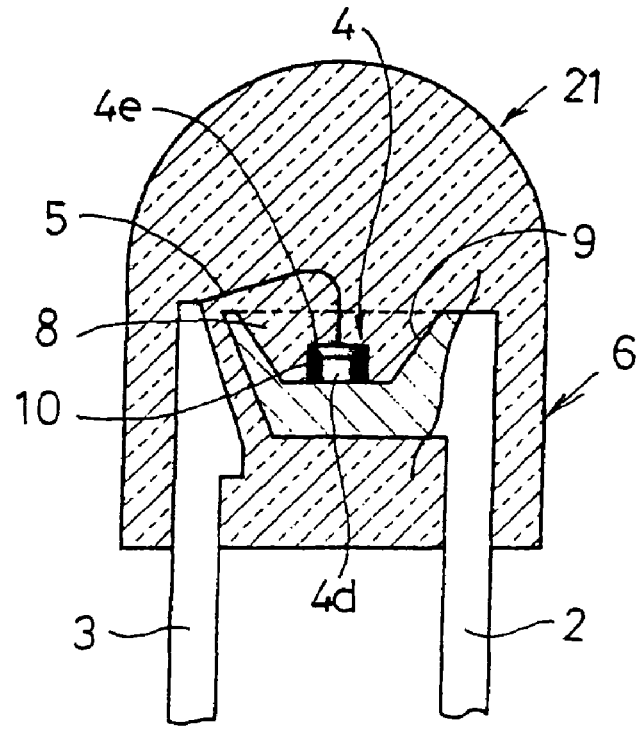
FIG. 5 shows a principal portion of an LED lamp according to a third embodiment.
Figure 6:
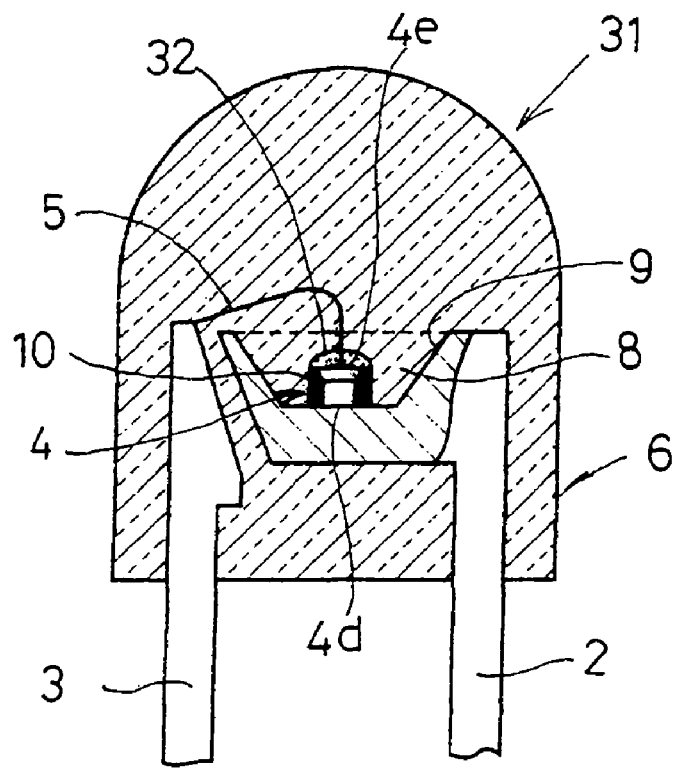
FIG. 6 shows a principal portion of an LED lamp according to a fourth embodiment.

In the structure shown in FIG. 5, part of blue light may be emitted upward through the p-electrode 4e provided on the upper surface. In this case, like the LED lamp 31 according to the fourth embodiment shown in FIG. 6, the p-electrode 4e is also coated with light-transmitting synthetic resin 32 containing a fluorescent material in a powder state after the metal wire 5 for wire bonding is connected to the electrode. With this structure, the blue light generated at the light emitting layer 4c of the LED chip 4 can be entirely changed into white light.

Figure 7:
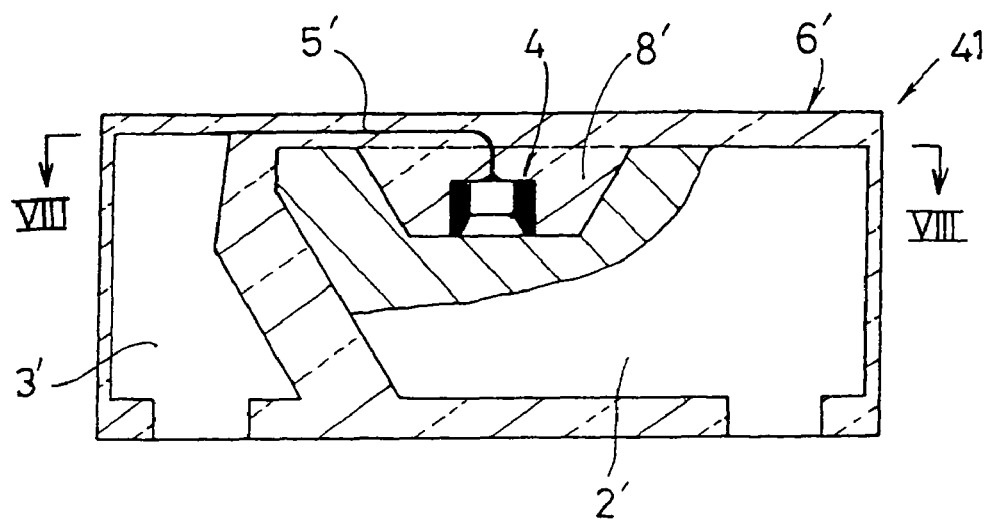
FIG. 7 is a vertical sectional view showing an LED lamp according to a fifth embodiment.
Figure 8:
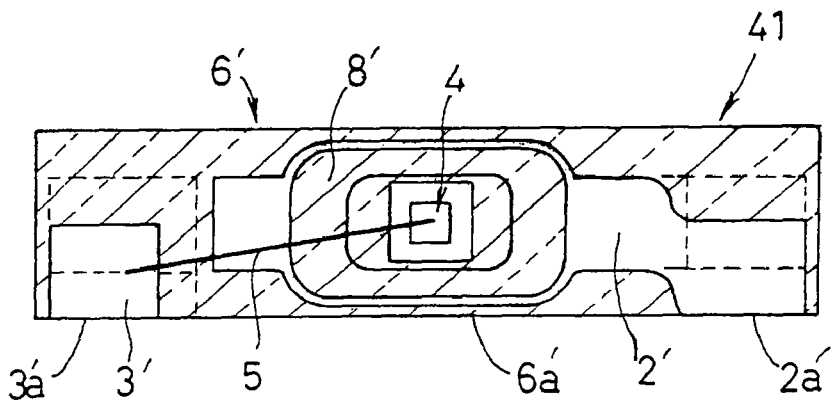
FIG. 8 is a sectional view taken along lines VIII-VIII in FIG. 7.

FIGS. 7 and 8 show an LED lamp 41 according to a fifth embodiment.

In this LED lamp 41, one of a pair of lead terminals 2' and 3' made of a metal plate, e.g. the lead terminal 2' has an end formed with a cup portion 8' by denting so that the inner peripheral surface flares outward and serves as a light-reflective surface 9. An LED chip 4 having the structure shown in FIGS. 2 and 3 is arranged in the cup portion 8', with the p-electrode 4e oriented downward while the n-electrode 4d oriented upward. The LED chip is die-bonded via conductive paste or solder so that the p-electrode 4e is electrically connected to the inner bottom surface of the cup portion 8', and the upwardly oriented n-electrode 4d of the LED chip 4 is connected to the other lead terminal 3' via a metal wire 5'.

The two lead terminals 2' and 3' are covered by a transparent synthetic resin member 6' in the form of a plate so that the lead terminals 2' and 3' are partially exposed at a surface 6a' of the transparent synthetic resin member 6' to serve as connection terminals 2a' and 3a'.

With this structure, the LED lamp is in the form of a plate at one surface of which connection terminals 2a' and 3a' for soldering are provided. Therefore, in addition the above-described advantages of the foregoing embodiments, the LED lamp 41 can be suitably constituted as a surface-mount LED lamp.

Figure 9:
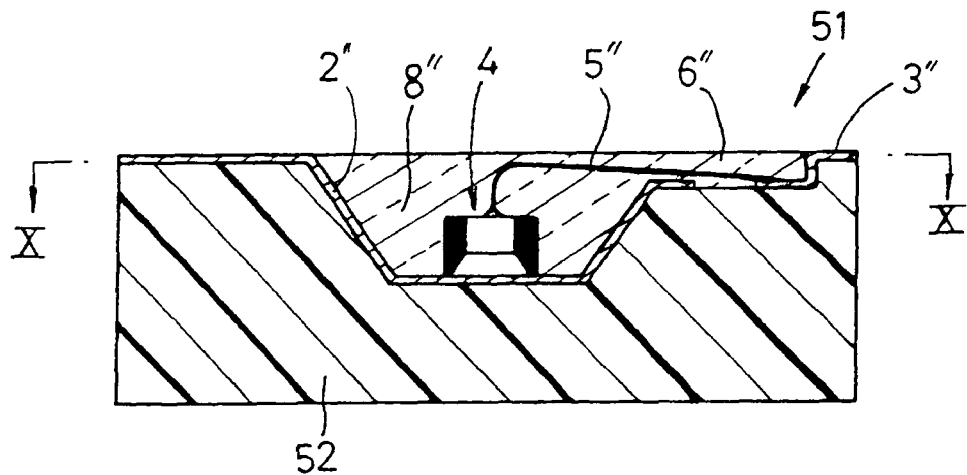
FIG. 9 is a vertical sectional view showing an LED lamp according to a sixth embodiment.
Figure 10:
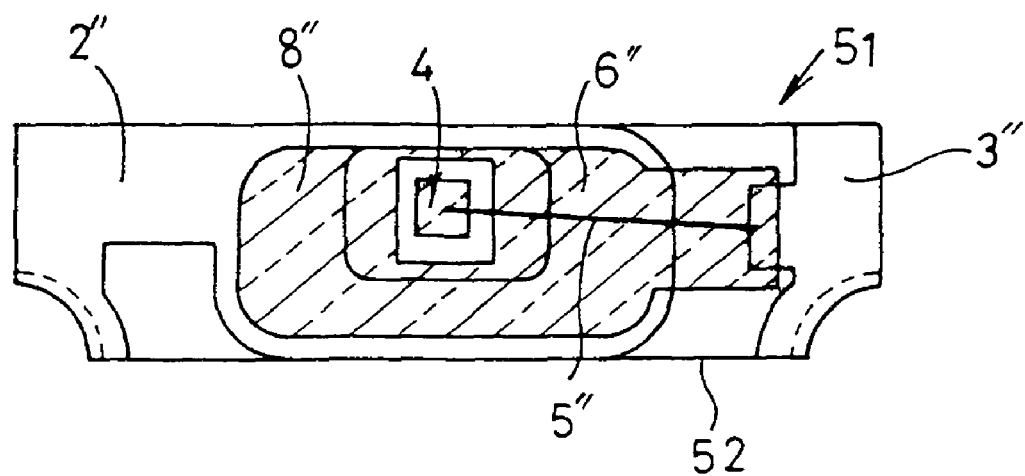
FIG. 10 is a sectional view taken along lines X-X in FIG. 9.

FIGS. 9 and 10 show an LED lamp 51 according to a sixth embodiment.

In this LED lamp 51, an end surface of an insulating member 52 which is in the form of a plate is dented to form a cup portion 8" having an inner peripheral surface flaring outward. A light-reflective electrode film 2" made of a metal such as silver is formed on the inner surface of the cup portion 8". An LED chip 4 having the structure shown in FIGS. 2 and 3 is arranged in the cup portion 8' with the p-electrode 4e oriented downward while the n-electrode 4d oriented upward. The LED chip is die-bonded via conductive paste or solder so that the p-electrode 4e is electrically connected to the electrode film 2" in the cup portion 8", and the n-electrode 4d of the LED chip 4 which is oriented upward is connected, via a metal wire 5", to another electrode film 3" formed on a surface of the insulating member 52.

The LED chip 4 and the metal wire 5" are covered by a transparent synthetic resin member 6" provided in the cup portion 8".

The entirety of the LED lamp 51 having the above-described structure is in the form of a thin plate and does not include a lead terminal made of metal. Therefore, the LED lamp can be suitably constituted as a light-weight surface-mount LED lamp.

In both of the fifth and sixth embodiments, the cup portion 8', 8" is elongated horizontally for use as a backlight source of e.g. a liquid crystal display. However, the second embodiment shown in FIG. 4, the third embodiment shown in FIG. 5 and the fourth embodiment shown in FIG. 6 can be applied to both of the fifth and the sixth embodiments.

The invention claimed is:

1. A light emitting diode lamp comprising:
a cup portion including a mounting bottom surface and a reflective side surface that flares from the bottom surface;
an LED chip mounted on the bottom surface of the cup portion and surrounded by the side surface;
a transparent resin member for covering at least the LED chip in the cup portion; and
a light-transmitting resin coating covering the LED within the transparent resin member and containing a fluorescent material;
the LED chip including a first surface provided with a first electrode, and a second surface located opposite to the first surface and provided with a second electrode;
the LED chip also including a lamination of a light emitting layer, an n-type semiconductor layer and a p-type semiconductor layer with the light emitting layer interposed between the n-type semiconductor layer and the p-type semiconductor layer, the lamination being located between the first and second electrodes; and
the n-type semiconductor layer including an inclined side surface that tapers from a position adjacent the second electrode toward the first electrode, the inclined side surface being covered by the light-transmitting resin coating;
wherein the n-type semiconductor layer also includes a vertical side surface extending from the inclined side surface toward the first electrode.

2. The light emitting diode lamp according to claim 1, further including a pair of lead terminals, one of the lead terminals including an end provided with the cup portion.

3. The light emitting diode lamp according to claim 2, wherein the transparent resin member is in a form of a plate and covers the lead terminals, each of the lead terminals including an edge surface exposed at a mounting surface of the transparent resin member, the edge surface of said each lead terminal being flush with the mounting surface of the transparent resin member.

4. The light emitting diode lamp according to claim 2, wherein the bottom surface of the cup portion is in a form of an elongated rectangle, the transparent resin member is in a form of a plate and covers the lead terminals, each of the lead terminals including an edge surface exposed at a mounting surface of the transparent resin member, the edge surface of said each lead terminal being flush with the mounting surface of the transparent resin member.

5. The light emitting diode lamp according to claim 1, further including an insulating substrate that is partially dented to provided the cup portion, and a light reflective electrode film formed on the bottom surface and side surface of the cup portion, the LED chip being mounted on the reflective electrode film at the bottom surface of the cup portion.

6. The light emitting diode lamp according to claim 1, wherein the bottom surface of the cup portion is in a form of an elongated rectangle.

7. The light emitting diode lamp according to claim 1, wherein one of the first and second electrodes is covered by an additional light-transmitting resin coating containing a fluorescent material.

8. A light emitting diode lamp comprising:
a cup portion including a mounting bottom surface and a reflective side surface that flares from the bottom surface;
an LED chip mounted on the bottom surface of the cup portion and surrounded by the side surface;
a transparent resin member for covering at least the LED chip in the cup portion; and
a light-transmitting resin coating covering the LED within the transparent resin member and containing a fluorescent material;
the LED chip including a first surface provided with a first electrode, and a second surface located opposite to the first surface and provided with a second electrode;
the LED chip also including a lamination of a light emitting layer, an n-type semiconductor layer and a p-type semiconductor layer with the light emitting layer interposed between the n-type semiconductor layer and the p-type semiconductor layer, the lamination being located between the first and second electrodes; and
the n-type semiconductor layer including an inclined side surface that tapers from a position adjacent the second electrode toward the first electrode, the inclined side surface being covered by the light-transmitting resin coating;
wherein the n-type semiconductor layer also includes a first vertical side surface extending from the inclined side surface toward the first electrode, and a second vertical side surface extending from the inclined side surface toward the second electrode.

* * * * *